US 6,627,472 B2

(12) United States Patent
Kimura

(10) Patent No.: US 6,627,472 B2
(45) Date of Patent: Sep. 30, 2003

(54) SEMICONDUCTOR LASER PRODUCING METHOD

(75) Inventor: Takashi Kimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 38 days.

(21) Appl. No.: 09/884,905

(22) Filed: Jun. 21, 2001

(65) Prior Publication Data

US 2002/0016014 A1 Feb. 7, 2002

(30) Foreign Application Priority Data

Jun. 22, 2000 (JP) .................................. 2000-188084

(51) Int. Cl.[7] .............................................. H01L 21/00
(52) U.S. Cl. ........................................ 438/31; 438/40
(58) Field of Search ............................. 438/24, 31, 39, 438/40, 42, 43, 46, 47

(56) References Cited

U.S. PATENT DOCUMENTS

| 5,658,824 | A | * | 8/1997 | Itoh et al. ................... 438/39 |
| 5,880,028 | A | * | 3/1999 | Yamamoto et al. ........... 438/31 |
| 5,882,951 | A | * | 3/1999 | Bhat ........................... 438/40 |
| 6,235,548 | B1 | * | 5/2001 | Ota et al. ................... 438/46 |

* cited by examiner

Primary Examiner—Chandra Chaudhari
(74) Attorney, Agent, or Firm—Rabin & Berdo, P.C.

(57) ABSTRACT

A ridge-type semiconductor laser producing method. This method includes the steps of successively laminating, on a compound semiconductor substrate, a lower clad layer, an active layer, and an upper first clad layer; forming, on the upper first clad layer, an upper second clad layer in the form of a ridge; and selectively growing a light confining layer at each side of the upper second clad layer in the form of a ridge. At the time of the selective growth of the light confining layers, there is used a III-group element feeding raw material including a III-group element compound having a methyl group.

16 Claims, 2 Drawing Sheets

SEMICONDUCTOR LASER PRODUCING METHOD

BACKGROUND OF THE INVENTION

1. Field of the Invention

The present invention relates to a semiconductor laser used in an optical disk device such as a CD-R/RW drive, DVD-RAM drive, MD drive or the like.

2. Description of Related Art

In an optical recording device, it has been intended to improve the recording speed. For example, a CD-R drive having a so-called 12-time recording speed is put into practical use. In such an optical recording device increased in recording speed, it is required to invoke a high-output laser light in an instant. As laser which can satisfy such requirements, there is known a ridge-type semiconductor laser using a compound semiconductor.

FIG. 1A to FIG. 1E are schematic section views illustrating the steps of producing a ridge-type semiconductor laser using a compound semiconductor material.

Successively formed on a substrate 1 are a lower clad layer 2, an active layer 3, an upper first clad layer 4, an etching stop layer 5, an upper second clad layer 6, and a contact layer 7. Further formed on the contact layer 7 is a mask layer 8, on which a resist pattern 9 is then formed (FIG. 1A). Each of the semiconductor portions is made of a GaAs-type material, and the mask layer 8 is generally made of $SiO_2$ or SiN.

Then, the mask layer 8 is etched according to the pattern of the resist 9 (FIG. 1B). After the resist 9 is removed, the contact layer 7 and the upper second clad layer 6 are etched in the form of a ridge. In the following description, both the upper second clad layer 6 and the contact layer 7 etched in the form of a ridge, are called a ridge section 12. The etching stop layer 5 is resistant to the etching medium. This prevents the etchings top layer 5 and the layers thereunder from being etched (FIG. 1C).

Then, light confining layers 10 are grown selectively at both sides of the ridge section 12 (FIG. 1D). At this time, no light confining layer 10 should be formed on the mask layer 8. When the light confining layers 10 are made of GaAs, triethylgallium is used as a gallium feeding raw material and a MOCVD (Metal-Organic Chemical Vapor Deposition) method is used, thus causing the light confining layers 10 to be selectively grown.

After the mask layer 8 is removed, a cap layer 11 is grown (FIG. 1E).

In the semiconductor laser having the arrangement above-mentioned, to confine the laser light in the vicinity of the active layer 3, each of the refractive index of the lower clad layer 2 and the refractive index of the upper first clad layer 4 must be lower than the refractive index of the active layer 3.

GaAs absorbs light. Accordingly, when the light confining layers 10 are made of GaAs, it is required to increase the thickness of the upper first clad layer 4 to prevent the GaAs of the light confining layers 10 from absorbing light. This increases the laser operating electric current, resulting in failure in acquirement of a high-output laser light.

SUMMARY OF THE INVENTION

In view of the foregoing, the inventor of this application got the idea that the light confining layers 10 are made of an AlGaAs-type material less in light absorption to enable the upper first clad layer 4 to be thinner to increase the oscillation efficiency, thus obtaining a high-output laser light. Then, he tried to form the light confining layers 10 having a composition of $Al_{y2}Ga_{(1-y2)}As$ with the use of triethylgallium as the gallium feeding raw material. As a matter of fact, it was found that the component material of the light confining layers 10 deposited also on the mask layer 8, and that the light confining layers 10 could not selectively be grown in the desired manner. It is noted that such deposits of the component material of the light confining layers 10 will be an obstacle to removal of the mask layer 8.

This problem may be solved by supplying a corrosive chlorine gas or the like at the time when the light confining layers 10 are selectively grown. However, this causes a variety of another trouble relating to handling of corrosive gas.

Further, to increase the light confining effect to prevent the laser light from spreading transversely in the vicinity of the active layer 3, the light confining layers 10 are preferably made of $Al_{y2}Ga_{(1-y2)}As$ of which refractive index is lower than that of the upper second clad layer 6. In an AlGaAs-type crystal, its refractive index is lower as the Al concentration is higher. Accordingly, the Al concentration of the light confining layers 10 is preferably higher than that of the upper second clad layer 6. When there is used an AlGaAs-type semiconductor, the upper second clad layer 6 generally has a composition of $Al_{x3}Ga_{(1-x3)}As$ ($0.3<x3<0.7$). Accordingly, the light confining layers 10 preferably have a composition of $Al_{y2}Ga_{(1-y2)}As$ ($0.4<y2<1.0$)

It is an object of the present invention to provide a semiconductor laser producing method capable of selectively growing, in the desired manner, light confining layers having an AlGaAs-type composition.

In other words, the specific object of the present invention is to provide a highly efficient semiconductor laser producing method.

A method of the present invention comprises the steps of: successively laminating, on a compound semiconductor substrate, a lower clad layer, an active layer, and an upper first clad layer; forming, on the upper first clad layer, an upper second clad layer in the form of a ridge; and selectively growing, at each side of the ridge-shape upper second clad layer, a light confining layer with the use of a III-group element feeding raw material comprising a III-group element compound having a methyl group (preferably without use of a III-group element compound having an ethyl group).

For example, when there is used a III-group element feeding raw material comprising a III-group element compound having a methyl group for forming the light confining layers according to an MOCVD method or the like, the light confining layers can successfully be grown selectively at the sides of the ridge-shape upper second clad layer. Further, according to the method of the present invention, it is not required to use corrosive chlorine gas when forming the light confining layers.

Preferably, the light confining layers have a composition of $Al_{y2}Ga_{(1-y2)}As$ ($0<y2<1.0$).

When the light confining layers are composed of $Al_{y2}Ga_{(1-y2)}As$ ($0<y2<1.0$) less in light absorption, the upper first clad layer can be reduced in thickness, thus enabling the semiconductor laser to supply a high-output laser light. For selectively growing, at the sides of the ridge-shape upper second clad layer, the light confining layers having the composition range above-mentioned, it is effective to use a III-group element feeding raw material comprising a III-group element compound having a methyl group.

More preferably, the light confining layers have a composition of $Al_{y2}Ga_{(1-y2)}As$ (0.4<y2<1.0).

To prevent the laser light in the vicinity of the active layer from spreading transversely such that the laser light is confined in the area under the ridge-shape upper second clad layer, the refractive index of the light confining layers must be lower than that of the upper second clad layer. In an AlGaAs-type crystal, its refractive index is lower as the Al concentration is higher. In an AlGaAs-type semiconductor laser, the upper second clad layer generally has a composition of $Al_{x3}Ga_{(1-x3)}As$ (0.3<x3<0.7). Accordingly, the light confining layers preferably have a composition of $Al_{y2}Ga_{(1-y2)}As$ (0.4<y2<1.0). According to the method of the present invention, the light confining layers having such a composition can be formed.

An embodiment of the method of the present invention comprises the steps of: forming, on a GaAs substrate, a lower clad layer of $Al_{x1}Ga_{(1-x1)}As$; forming an active layer on the lower clad layer; forming, on the active layer, an upper first clad layer of $Al_{x2}Ga_{(1-x2)}As$; forming, on the upper first clad layer, a ridge-shape upper second clad layer of $Al_{x3}Ga_{(1-x3)}As$; and selectively growing, at each side of the upper second clad layer, a light confining layer with the use of a III-group element feeding raw material comprising a III-group element compound having a methyl group, this selective growth being conducted according to an MOCVD method for example.

When the specific component materials of a semiconductor laser are set as above-mentioned, an AlGaAs-type semiconductor laser can be formed. The active layer maybe made of a single layer of $Al_{y1}Ga_{(1-y1)}As$ or multiple layers having two types of different composition layers. More specifically, the active layer may be an MQW (Multi Quantum Well) active layer composed of $Al_{y11}Ga_{(1-y11)}As$ and $Al_{y12}Ga_{(1-y12)}As$ (y11≠y12), or may be an MQW active layer composed of $Al_{y1}Ga_{(1-y1)}As$ and GaAs.

By using a III-group element feeding raw material comprising a III-group element compound having a methyl group, the light confining layers can successfully be grown selectively at the sides of the ridge-type upper second clad layer.

Preferably, the step of selectively growing the light confining layers comprises a step of forming a mask of $SiO_2$ or SiN on the upper second clad layer.

The upper second clad layer may be formed in the following manner. There is formed, on the upper first clad layer, a continuous layer made of the material of the upper second clad layer, and the unnecessary portions of this continuous layer are etched such that the upper second clad layer is made in the form of a ridge. In this case, the mask layer is preferably formed on the upper second clad layer in a continuous form.

By forming the light confining layers with the use of a III-group element feeding raw material comprising a III-group element compound having a methyl group, it is possible to effectively restrain the component material of the light confining layers from depositing on the mask of $SiO_2$ and SiN. More specifically, the light confining layers can successfully be grown selectively at the sides of the ridge-shape upper second clad layer.

Preferably, the III-group element feeding raw material comprises trimethylgallium. In this case, gallium can be fed as a III-group element at the time when forming an AlGaAs-type semiconductor laser.

Preferably, the III-group element feeding raw material comprises trimethylaluminium. In this case, aluminium can be fed as a III-group element at the time when forming an AlGaAs-type semiconductor laser.

Preferably, the selective growth of the light confining layers is conducted at temperature in the range from 500° C. to 750° C. When the temperature is lower than 500° C., the film quality of the light confining layers might possibly be deteriorated. When the temperature exceeds 750° C., this involves the likelihood that a film of the component material of the light confining layers is undesirably grown also on the mask. In this point of view, the temperature is more preferably in the range of 600 to 700° C.

As thus discussed, according to the method of the present invention, the light confining layers having an AlGaAs-type composition can be grown selectively at both sides of the ridge-shape upper second clad layer. Thus, the resultant semiconductor laser enables the laser light to be confined in the area under the ridge section without the laser light remarkably attenuated. Such a semiconductor laser can oscillate at high efficiency. More specifically, such a semiconductor laser can provide a higher-output laser light at a predetermined electric power.

These and other features, objects and advantages of the present invention will be more fully apparent from the following detailed description set forth below when taken in conjunction with the accompanying drawings.

DESCRIPTION OF THE PREFERRED EMBODIMENTS

Figure 2:
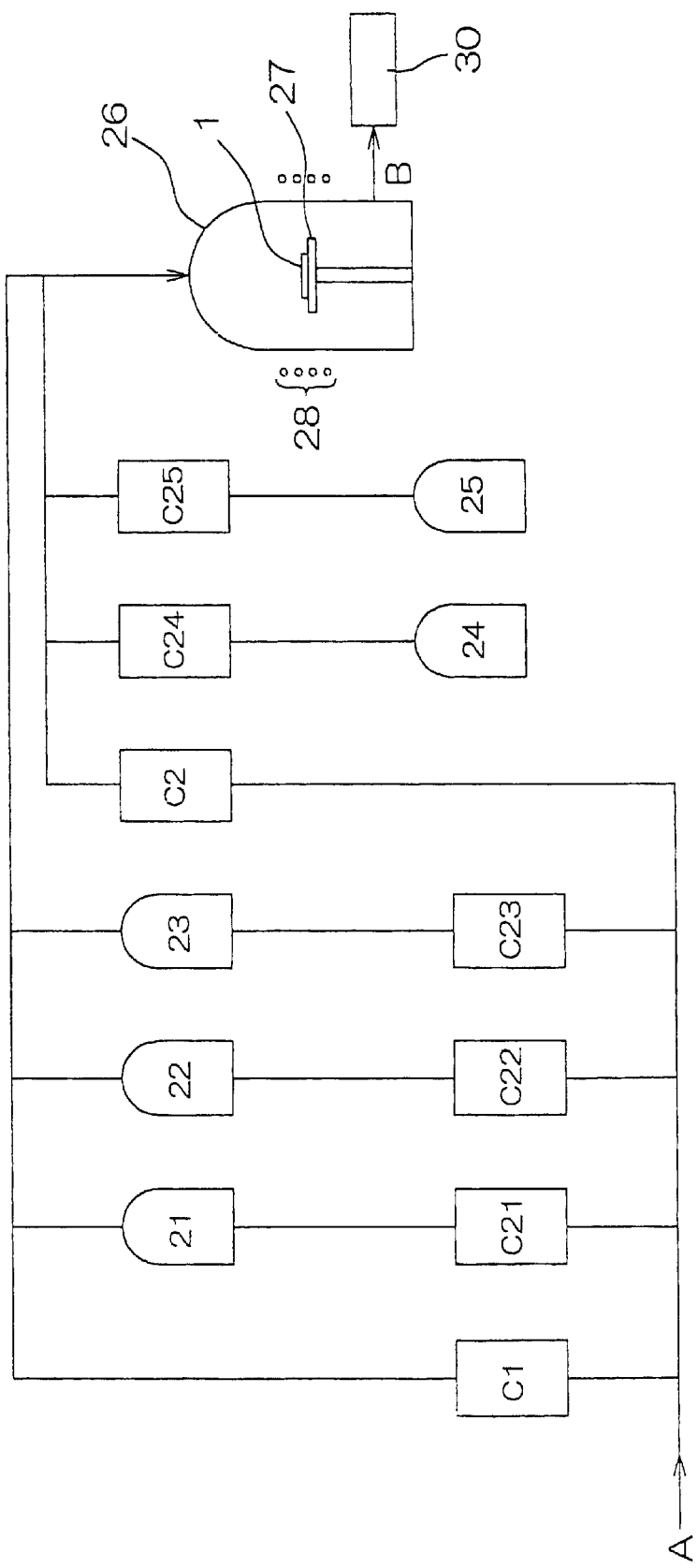
FIG. 2 is a schematic view of a compound semiconductor producing apparatus using an MOCVD method.

FIG. 2 is a schematic view illustrating a thin-film forming apparatus for carrying out an embodiment of the method of the present invention.

Carrier gas introduced from a section A is arranged to introduce, at a suitable rate in quantity, the element feeding raw materials respectively stored in raw material storage tanks 21–23 and raw material storage cylinders 24 and 25 to a reaction chamber 26. The raw materials transferred onto a heated substrate 1 are decomposed to form a compound semiconductor thin film.

Raw materials in the form of a liquid at room temperature are stored in the raw material storage tanks 21–23. At the time of thin-film forming, these raw materials are bubbled by carrier gas and transferred to the reaction chamber 26 therewith. The flow amounts of the carrier gas used for bubbling the respective raw materials, are adjusted by flow amount controllers C21–C23. These gases are mixed with carrier gas of another system controlled in flow amount by a flow amount controller C1, and are then supplied to the reaction chamber 26. The speeds at which the respective element feeding raw materials are supplied to the reaction chamber 26, are adjusted by controlling the vapor pressures of the element feeding raw materials by adjusting the temperatures of the raw material storage tanks 21–23.

Raw materials in the form of gas at room temperature are stored, as maintained at pressures higher than the pressure of the reaction chamber 26, in the raw material storage cylinders 24 and 25. At the time of thin-film forming, these raw materials are transferred to the reaction chamber 26 together with carrier gas controlled in flow amount by a flow amount controller C2. The speeds at which the respective raw materials are supplied to the reaction chamber 26, are adjusted by flow amount controllers C24 and C25.

A substrate 1 is made of GaAs and placed on a susceptor 27. The susceptor 27 is subjected to radiofrequency induction heating by a coil 28 for controlling the temperature of the substrate 1. The respective raw materials introduced into the reaction chamber 26 are decomposed on the heated substrate 1 to form a thin film of a predetermined composition.

The raw materials and carrier gases having passed through the vicinity of the substrate 1, go out from the reaction chamber 26 through a section B and is introduced into a detoxifying section 30. The passages and thin film forming members from the section A to the section B are hermetically sealed and perfectly shut off from the outside air.

With the use of the apparatus having the arrangement above-mentioned, a semiconductor laser is to be produced. Referring again to FIG. 1, the following description will discuss a specific production method.

A substrate 1 is put in the thin film forming apparatus above-mentioned. Then, successively formed on the substrate 1 are a lower clad layer 2, an active layer 3, an upper first clad layer 4, an etching stop layer 5, an upper second clad layer 6 and a contact layer 7.

The substrate 1 is made of an n-type GaAs compound semiconductor, and the lower clad layer 2 is made of an n-type $Al_{x1}Ga_{(1-x1)}As$ (0.3<x1<0.7) The conduction type of the active layer 3 may be an n-type, p-type or undoped. The active layer 3 maybe made of a single layer of $Al_{y1}Ga_{(1-y1)}As$ or multiple layers having two types of different composition layers. More specifically, the active layer 3 may be an MQW (Multi Quantum Well) active layer composed of $Al_{y11}Ga_{(1-y11)}As$ and $Al_{y12}Ga_{(1-y12)}As$ (y11≠y12), or may be an MQW active layer composed of $Al_{y1}Ga_{(1-y1)}As$ and GaAs. The upper first clad layer 4 is made of p-type $Al_{x2}Ga_{(1-x2)}As$.

The etching stop layer 5 is made of $Al_zGa_{(1-z)}As$ (0≦z<1.0) or $InGa_{(1-z)}Al_zP$ (0<z<0.5), and the conduction type of the etching stop layer 5 is a p-type or undoped. The upper second clad layer 6 is made of p-type $Al_{x3}Ga_{(1-x3)}As$ (0.3<x3<0.7), and the contact layer 7 is made of p-type GaAs.

Then, the substrate 1 is transferred to a separate sputtering apparatus, in which a mask layer 8 of $SiO_2$ or SiN is formed on the surface of the substrate 1.

Figure 1A:
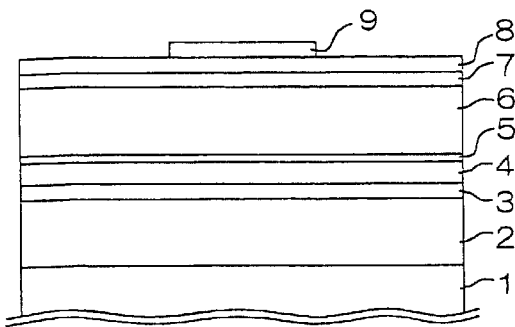
FIG. 1A to FIG. 1E are schematic section views illustrating the steps of producing a ridge-type semiconductor laser.
Figure 1D:
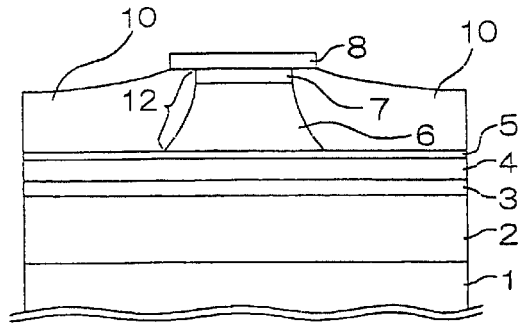
Figure 1B:
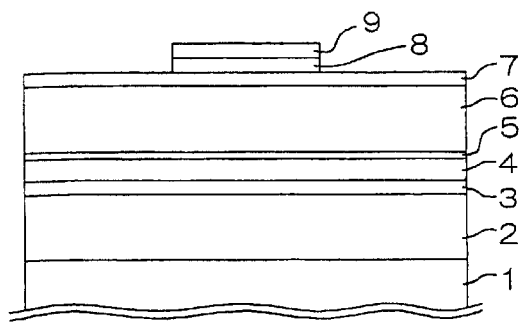
Figure 1E:
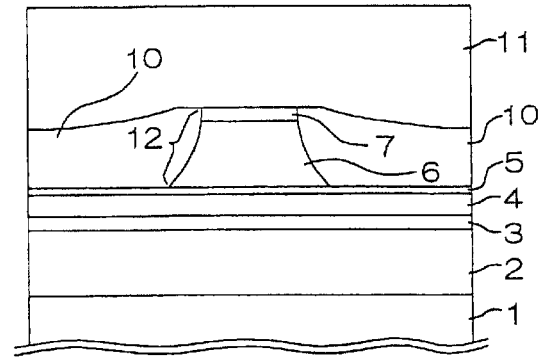
Figure 1C:
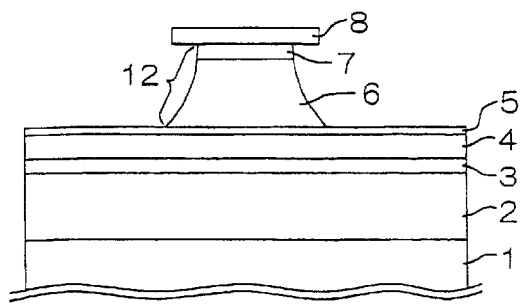

According to a photoresist method, a resist 9 is formed on the mask layer 8 (FIG. 1A) and the mask layer 8 is etched in the form of a stripe (FIG. 1B). Then, the resist 9 is removed, and the contact layer 7 and the upper second clad layer 6 are wet- or dry-etched in the form of a ridge. The etching stop layer 5 is resistant to the etching medium. Therefore, the etching stop layer 5 and the layers thereunder are not etched (FIG. 1C).

The sample thus obtained is returned to the thin film forming apparatus, in which a light confining layer 10 of n-type $Al_{y2}Ga_{(1-y2)}As$ (0<y2<1.0) is formed at each side of the ridge section 12. At this time, when there is used a III-group element feeding raw material comprising a compound having a methyl group, a light confining layer 10 comprising a III-group element can be formed selectively at each side of the ridge section 12.

Then, the mask layer 8 is removed by etching, and a cap layer 11 of GaAs is formed on the light confining layers 10 and the contact layer 7.

To confine the laser light in the vicinity of the active layer 3 such that the laser light does not spread in the longitudinal and transverse directions, the refractive indexes of the respective layers may be set such that the refractive index of the active layer 3 is the largest, the refractive index of the upper second clad layer 6 is the second largest, and the refractive index of each light confining layer 10 is the smallest. In this connection, provision is made such that the aluminium concentration of the light confining layers 10 is larger than that of the upper second clad layer 6.

In the semiconductor laser thus obtained, the laser light is confined into an area in the vicinity of the active layer 3 under the ridge section 12 according to differences in refractive index of the respective layers, thus preventing the laser light from being remarkably attenuated. Further, the light confining layers 10 are made of $Al_{y2}Ga_{(1-y2)}As$ (0<y2<1.0) which is less in light absorption. Accordingly, the upper first clad layer 4 can be reduced in thickness to lower the operating electric current. Thus, this semiconductor laser is highly efficient and capable of providing a high output at a predetermined electric power.

The semiconductor laser above-mentioned is an example of the AlGaAs type, but an InGaAlP-type semiconductor laser may also be produced in a similar manner.

EXAMPLE 1

There were formed an upper second clad layer 6 of p-type $Al_{0.6}Ga_{0.4}As$, a contact layer 7 of p-type GaAs and a mask layer 8 of $SiO_2$. With the use of the apparatus shown in FIG. 2, there were formed light confining layers 10 of n-type $Al_{0.07}Ga_{0.3}As$.

As the carrier gas, $H_2$ was used. As raw materials for feeding the main components, i.e., gallium, aluminium and arsenic, there were respectively used trimethylgallium trimethylaluminium and arsine.

Further, monosilane was used as a raw material for feeding impurity or silicon for causing the light confining layers 10 to be n-type semiconductors. When forming a p-type semiconductor member such as the upper second clad layer 6 or the like, zinc dimethyl was used as a raw material for feeding impurity or zinc for forming a p-type semiconductor.

The trimethylgallium and the trimethylaluminium each in the form of a liquid at room temperature, were stored in the raw material storage tanks 21 and 22. These raw materials were bubbled by carrier gas and transferred to the reaction chamber therewith. The raw material feeding speeds were adjusted by controlling the vapor pressures of the raw materials by adjusting the temperatures of the raw material storage tanks 21 and 22. The flow amounts of the carrier gas at respective sections were adjusted to suitable values by the flow amount controllers C21, C22 and C1.

Arsine and monosilane in the form of gas at room temperature were stored in the raw material storage cylinders 24 and 25. These materials were controlled in flow amount by the flow amount controllers C24 and C25, and transferred to the reaction chamber 26 at predetermined feeding speeds together with carrier gas suitably controlled in flow amount by the flow amount controller C2.

The substrate heating temperature was set to 650° C.

The configuration of a section of the sample thus obtained was observed by an SEM (Scanning Electron Microscope) to check the light confining layers 10 for distribution. It was found that the light confining layers 10 were formed only at the sides of the ridge section 12 and did not deposit on the mask layer 8.

The surface of the sample thus obtained was observed by a light microscope for evaluating the film quality of the light confining layers 10. The film quality was fine.

EXAMPLE 2

Light confining layers 10 were formed under the same conditions as those of Example 1, except that the substrate heating temperature was set to 500° C.

A section of the sample thus obtained was evaluated in the same manner as in Example 1. It was found that the light confining layers 10 were formed only at the sides of the ridge section 12 and did not deposit on the mask layer 8. The film quality of the light confining layers 10 was relatively coarse.

EXAMPLE 3

Light confining layers 10 were formed under the same conditions as those of Example 1, except that the substrate heating temperature was set to 750° C.

A section of the sample thus obtained was evaluated in the same manner as in Example 1. It was found that the light confining layers 10 were successfully grown selectively at the sides of the ridge section 12. On the mask layer 8, there were observed only slight deposits of the component material of the light confining layers 10. The film quality of the light confining layers 10 was fine.

EXAMPLE 4

Light confining layers 10 were formed under the same conditions as those of Example 1, except that triethylgallium was used as the gallium feeding raw material.

A section of the sample thus obtained was evaluated in the same manner as in Example 1. It was found that the light confining layers 10 were generally successfully grown selectively at the sides of the ridge section 12. However, on the mask layer 8, there were observed slight deposits of the component material of the light confining layers 10. The film quality of the light confining layers 10 was fine.

COMPARATIVE EXAMPLE

Light confining layers 10 were formed under the same conditions as those of Example 1, except that triethylgallium was used as the gallium feeding raw material and triethylaluminium as the aluminium feeding raw material.

A section of the sample thus obtained was evaluated in the same manner as in Example 1. It was found that the light confining layers 10 were formed at the sides of the ridge section 12. Further, on the mask layer 8, there were observed deposits of the component material of the light confining layers 10.

Table 1 collectively shows the results of Examples and Comparative Example. By using a III-group element feeding raw material comprising a III-group element compound having a methyl group, the light confining layers 10 of $Al_{y2}Ga_{(1-y2)}As$ can successfully be grown selectively at the sides of the ridge section 12 comprising the upper second clad layer 6 and the contact layer 7.

TABLE 1

| | Film Forming Conditions | | Sub-strate Temperature (° C.) | Evaluation Result of Light Confining Layer | |
|---|---|---|---|---|---|
| | Gallium Feeding Raw Material | Aluminium Feeding Raw Material | | Growth on the Mask Layer | Film Quality |
| Example 1 | Trimethyl-gallium | Trimethyl-aluminium | 650 | None | Fine |
| Example 2 | Trimethyl-gallium | Trimethyl-aluminium | 500 | None | Relatively Coarse |
| Example 3 | Trimethyl-gallium | Trimethyl-aluminium | 750 | Slightly Observed | Fine |
| Example 4 | Triethyl-gallium | Trimethyl-aluminium | 650 | Observed | Fine |
| Comparative Example | Triethyl-gallium | Triethyl-aluminium | 650 | Observed | Fine |

Further, it is understood that the substrate temperature is preferably in the range of 500 to 750° C. When the temperature exceeds 750° C., this results in a relatively large amount of deposit, on the mask layer 8, of a film of the component material of the light confining layers 10 even though trimethylgallium and trimethylaluminium are used as the III-group element feeding raw materials. When the temperature is below 500° C., the resultant light confining layers 10 are relatively coarse in film quality. This involves the likelihood that no predetermined electric characteristics are assured.

As shown in Table 1, however, at the upper limit of the temperature range above-mentioned, there is already observed the trend that the component material of the light confining layers 10 start depositing also on the mask layer 8, and at the lower temperature limit, there is observed the trend that the film quality becomes coarse. Accordingly, the temperature is more preferably in the range from 600 to 700° C.

In forming the light confining layers 10, corrosive chlorine gas is not used. This requires no facilities for handling chlorine gas, thus preventing the production facilities from being complicated.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This application is based on a Japanese Patent application No. 2000-188084 filed on Jun. 22, 2000 with Japanese Patent Office, the contents of which are incorporated herein by reference.

What is claimed is:

1. A semiconductor laser producing method comprising the steps of:
   successively laminating, on a compound semiconductor substrate, a lower clad layer, an active layer, and an upper first clad layer;
   forming, on the upper first clad layer, an upper second clad layer in a form of a ridge; and
   selectively growing, at each side of the upper second clad layer in the form of a ridge, a light confining layer with a use of a III-group element feeding raw material comprising a III-group element compound having a methyl group, wherein the light confining layers have a composition of $Al_{y2}Ga_{(1-y2)}As$ ($0<y2<1.0$).

2. A semiconductor laser producing method according to claim 1, wherein the light confining layers have a composition of $Al_{y2}Ga_{(1-y2)}As$ ($0.4<y2<1.0$).

3. A semiconductor laser producing method according to claim 1, wherein the step of selectively growing the light confining layers is conducted without use of a III-group element compound having an ethyl group.

4. A semiconductor laser producing method according to claim 1, wherein the step of selectively growing the light confining layers is conducted according to an MOCVD method.

5. A semiconductor laser producing method according to claim 1, wherein the step of selectively growing the light confining layers includes a step of forming a mask of $SiO_2$ or SiN on the upper second clad layer.

6. A semiconductor laser producing method according to claim 1, wherein the III-group element feeding raw material includes trimethylgallium.

7. A semiconductor laser producing method according to claim 1, wherein the III-group element feeding raw material includes trimethylaluminium.

8. A semiconductor laser producing method according to claim 1, wherein the selective growth of the light confining layers is conducted at temperature in a range from 500° C. to 750° C.

9. A semiconductor laser producing method comprising the steps of:

forming, on a GaAs substrate, a lower clad layer of $Al_{x1}Ga_{(1-x1)}As$;

forming an active layer on the lower clad layer;

forming, on the active layer, an upper first clad layer of $Al_{x2}Ga_{(1-x2)}As$;

forming, on the upper first clad layer, a ridge-shape upper second clad layer of $Al_{x3}Ga_{(1-x3)}As$; and selectively growing, at each side of the upper second clad layer, a light confining layer of $Al_{y2}Ga_{(1-y2)}As$ with a use of a III-group element feeding raw material comprising a III-group element compound having a methyl group.

10. A semiconductor laser producing method according to claim 9, wherein the light confining layers have a composition of $Al_{y2}Ga_{(1-y2)}As$ (0.4<y2<1.0).

11. A semiconductor laser producing method according to claim 9, wherein the step of selectively growing the light confining layers is conducted without use of a III-group element compound having an ethyl group.

12. A semiconductor laser producing method according to claim 9, wherein the step of selectively growing the light confining layers is conducted according to an MOCVD method.

13. A semiconductor laser producing method according to claim 9, wherein the step of selectively growing the light confining layers includes a step of forming a mask of $SiO_2$ or SiN on the upper second clad layer.

14. A semiconductor laser producing method according to claim 9, wherein the III-group element feeding raw material includes trimethylgallium.

15. A semiconductor laser producing method according to claim 9, wherein the III-group element feeding raw material includes trimethylaluminium.

16. A semiconductor laser producing method according to claim 9, wherein the selective growth of the light confining layers is conducted at temperature in a range from 500° C. to 750° C.

* * * * *